United States Patent [19]

Skog

[11] 4,362,595

[45] Dec. 7, 1982

[54] SCREEN FABRICATION BY HAND CHEMICAL BLANKING

[75] Inventor: Jack E. Skog, Seattle, Wash.

[73] Assignee: The Boeing Company, Seattle, Wash.

[21] Appl. No.: 150,735

[22] Filed: May 19, 1980

[51] Int. Cl.³ .................. C23F 1/02; B44C 1/22; C03C 15/00; C03C 25/06

[52] U.S. Cl. ..................... 156/626; 156/634; 156/639; 156/640; 156/651; 156/661.1; 219/203; 428/201; 428/596; 430/313; 430/316; 430/318; 430/321; 430/329

[58] Field of Search .............. 219/203, 10.55 D, 547, 219/522, 543, 532; 428/34, 199, 201, 203, 209, 596; 338/308; 430/313, 316, 318, 319, 321, 329; 204/24; 427/247; 156/99–107, 109, 150, 151, 634, 637, 638, 639, 640, 644, 656, 659.1, 661.1, 666, 627, 626, 651; 252/79.2

[56] References Cited

U.S. PATENT DOCUMENTS

| | | | |
|---|---|---|---|
| 1,117,128 | 11/1914 | Camm | 219/203 |
| 2,226,381 | 12/1940 | Norris | 156/640 |
| 2,315,903 | 4/1943 | Ormond | 156/666 |
| 2,572,497 | 10/1951 | Law | 156/666 |
| 2,684,892 | 7/1954 | Saulnier | 156/666 |
| 2,732,288 | 1/1956 | Holman et al. | 156/639 |
| 2,872,302 | 2/1959 | Bulan | 156/666 |
| 2,958,754 | 11/1960 | Hahn | 219/10.55 D |
| 2,978,389 | 4/1961 | Turnbull | 204/24 |
| 3,362,911 | 1/1968 | Byers et al. | 156/666 |
| 3,409,759 | 11/1968 | Boicey et al. | 156/99 X |
| 3,421,865 | 1/1969 | Hanson et al. | 156/666 |
| 3,440,408 | 4/1969 | Brittan | 219/203 X |
| 3,494,815 | 2/1970 | Yoshimatsu | 156/639 |
| 3,546,075 | 12/1970 | Sheetz et al. | 156/644 X |
| 3,580,737 | 5/1971 | Traynor | 156/666 |
| 3,584,376 | 6/1971 | Howe et al. | 156/644 X |
| 3,647,584 | 3/1972 | Duffy | 156/640 |
| 3,808,071 | 4/1974 | Lerner | 156/345 X |
| 3,936,332 | 2/1976 | Matsumoto et al. | 252/79.4 X |
| 4,038,040 | 7/1977 | Nagl | 204/24 X |
| 4,042,450 | 8/1977 | Voitovich et al. | 156/652 |
| 4,054,484 | 10/1977 | Lesh et al. | 156/652 |
| 4,063,993 | 12/1977 | Burns | 156/666 |
| 4,073,704 | 2/1978 | Hick | 156/666 |
| 4,288,282 | 9/1981 | Brown et al. | 156/659.1 X |

FOREIGN PATENT DOCUMENTS 52-27028  3/1977  Japan .................. 156/644

Primary Examiner—William A. Powell
Attorney, Agent, or Firm—David L. Garrison; Robert Gullette

[57] ABSTRACT

A method of fabricating very fine metal screens for use in a transparent or translucent panel through which visible light is transmittable but which acts as a barrier against transmissions of pulsed electromagnetic radiation which may be harmful to humans or disruptive to electronic gear. The screens are fabricated by printing a pattern photographically upon a first surface of a metal foil covered on both sides by a positive, photo sensitive etchant mask and removing exposed areas of the mask with a developer. The masked foil is then chemically blanked by application of an etchant to the first side only of the foil. The specimen is rotated 90 degrees on a frequent basis to prevent selective etching, especially in areas adjacent the periphery of the screen. The protective mask and the mask on the second side of the foil are then exposed to light and removed from the screen leaving a screen presenting minimum optical distortion and visual blocking therethrough and possessing unimpeded electrical conductivity in all directions.

11 Claims, 3 Drawing Figures

SCREEN FABRICATION BY HAND CHEMICAL BLANKING

This invention was conceived and developed in the course of work under U.S. Government Contract No. F 19628-74-C-0127 awarded by the United States Air Force.

FIELD OF THE INVENTION

This invention relates to planar fine mesh screen structures, methods for preparing such screen structures and translucent or transparent panels incorporating such screen structures.

This invention further relates to a method of preparing screens from metallic foils wherein an etchant is applied to a previously photographically printed foil from one side only of the foil whereby the unmasked portion of the foil is removed by the etchant leaving a planar screen structure.

This invention further relates to a method for preparing a thin wire screen having thin strands which provide little distortion and loss of visual acuity when viewing through the panel and possessing uninterrupted and unimpeded conductivity in all directions.

PRIOR ART

Screens of large grid sizes and of small overall size can be manufactured using conventional photo processing and automated etching techniques well known in the prior art. Conventionally, screens of any size are formed by applying a photo sensitive masking material to both surfaces of a foil or sheet of metal, photographically printing the desired pattern on both sides of the sheet or foil, taking care to obtain registry of the patterns, removing the masking material from areas not printed and then, simultaneously applying an etchant to both sides of the sheet such as by immersion of the masked and patterned foil or sheet into a bath of the etchant to remove the portion of the metal not covered by the resistant, patterned mask from both sides of the foil or sheet. The prior art methods work well for screens of relatively large grid size with relatively heavy, large cross sectional areas for the individual "wires" forming the screen. When manufacturing screens having very fine mesh size and/or thin wire cross section was attempted using the prior art technique it was found that the conventional process could not provide adequate registry for the printing of the patterns photographically on both sides of the foil being used and consequently the screen thus formed had non-uniform wire cross section and otherwise failed to meet inspection standards.

As noted above, screens of small area with larger grid patterns are commonly made by conventional photo processing using automated machines to etch the screen simultaneously from both sides; however, similar equipment to etch larger screens from a thin sheet of metal, particularly those screens having a very thin wire cross section, are not presently available and would have to be specially built and installed at great expense. In addition, present automated equipment will not permit the formation of fine grid patterns such as screen with a wire width of 0.005 inches or less by the prior art methods of simultaneously etching from both sides. Even in such automated systems inadequate registry of the patterns occurs. Furthermore, the automated machine etching systems have in the past produced screens having unacceptable dimensional tolerances not suitable for use in applications in which a transparent or translucent panel through which visible light is transmittable having the screen of this invention therein to act as a barrier against transmission of various types of electromagnetic radiation which might be harmful to humans or disruptive to electronic gear.

Screens formed by weaving thin wires cannot be relied upon to provide certain unimpeded electrical conductivity in all directions since a mere mechanical intersection results at the points of contact between the overlapped wires.

SUMMARY OF THE INVENTION

Screens having small wire dimensions, large grid sizes and unimpeded electrical transmissivity to the periphery thereof due to the absence of potentially non-conductive wire interfaces are formed by trimming a sheet of metallic foil to the desired overall size, cleaning and preparing both sides of the foil to receive an adherent light reactive photoresist coating, which is applied by rolling, spraying or brushing to an even depth on each side of the foil. A photographically prepared template having grid lines drawn at the intervals required is used to expose portions of the photoresist which are to be removed. The coated and partially exposed foil is then baked in an oven to harden the unexposed photoresist and make it less susceptable to damage during handling. The exposed area on one side only of the foil is then washed away with a suitable developer leaving the grid lines of unexposed photoresist adhering to areas of the foil which are not to be removed by an acid etch. Exposed areas are etched with a suitable etchant for the metal, e.g. for copper a solution of sulphuric and chromic acid works well. The acid is then rinsed from the grid and the entire remaining article is exposed fully to light, rendering the remaining photoresist soluble for easy removal.

After dissolving the exposed photoresist from both sides of the screen, the screen may be tinned and then interposed between face adjacent translucent panels of glass or the like, to form a transparent or translucent panel which attenuates bursts of high energy electromagnetic radiation.

DESCRIPTION OF PREFERRED EMBODIMENT

Screens having unusually large grid structure made up of planar wire elements of small cross section and having excellent electrical conductivity in all directions are produced by a handphoto chemical blanking process for screen preparation.

Figure 1:
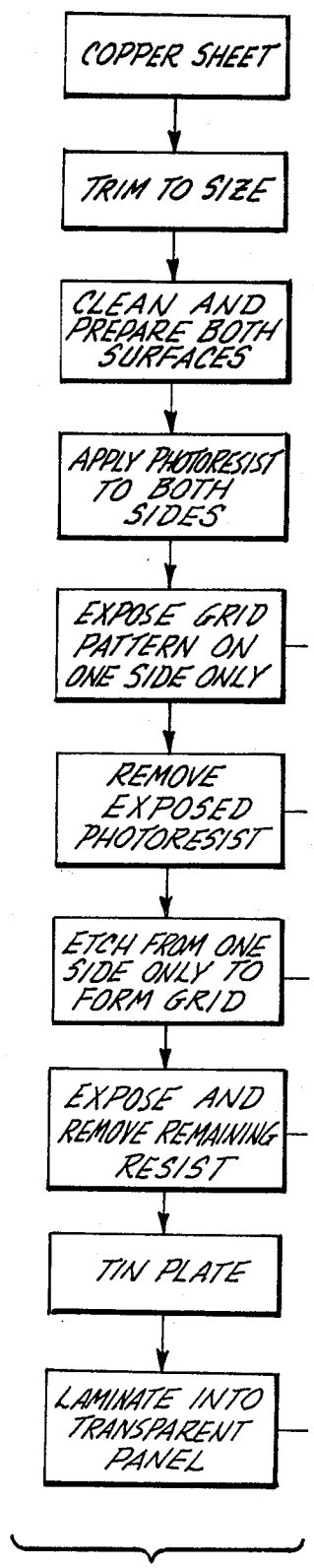
FIG. 1 is a flow chart of the process of this invention.
Figure 2:
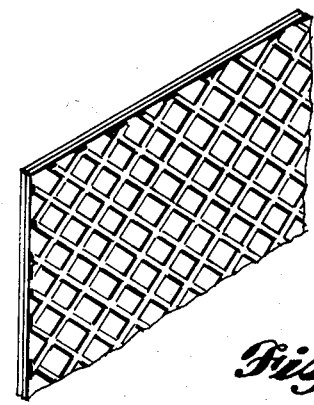
FIG. 2 shows cross sectional views of the article being manipulated in the process of FIG. 1 at various stages of FIG. 1.
Figure 3:
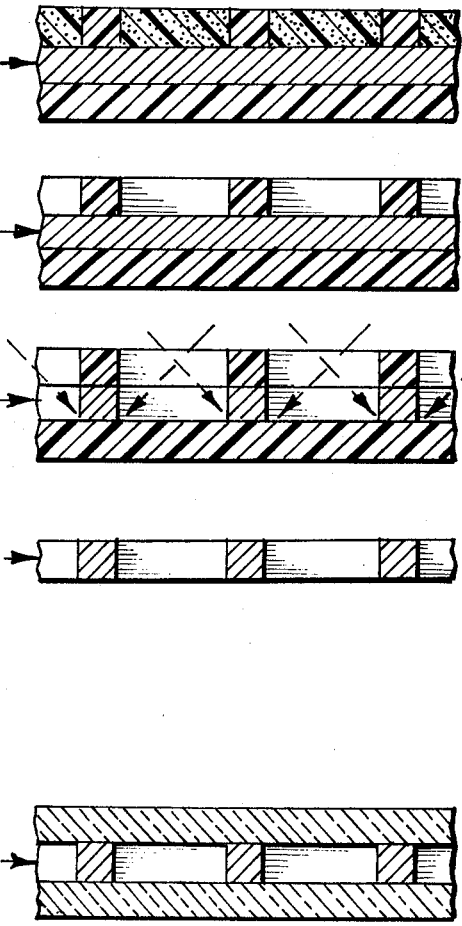
FIG. 3 shows a schematic representation of the screen of this invention wherein the individual wire-like elements of the screen are positioned in a plane which is substantially vertical with the individual wirelike elements at approximately 45 degrees to the horizontal for the hand controlled etching and rinsing steps.

As shown schematically in FIG. 1, the process involves cleaning and trimming a metal foil to the desired shape and size, masking a first side of the foil with a photo sensitive masking substance, which preferably is of the "positive" type so that a visible pattern will remain of the unexposed resist while the portion developed in the photo sensitive resist coating upon exposure to light will be washed away. A photomaster negative is used to form an unexposed grid in the marking substance. The pattern remaining after photochemically developing and removal of unwanted maskant permits the manufacture of screens having a thin wire cross section, e.g. a wire thickness of 0.005 inches or less. Following development of the light exposed resist surface the masking or resist material which was applied on areas intended to be removed by etching and which were exposed to light are washed off of the surface leaving the positive pattern of unexposed maskant corresponding to the screen to be etched. The back of the foil is completely covered with photo sensitive masking material which is not exposed. Hand chemical blanking is then utilized in a controlled light area to apply the chemical etchant, preferably an aqueous etchant fluid containing suitable acidic etching substances. The hand application permits the operator performing the etching to visually observe the uniformity of the metal removal. Simultaneous hand application of a neutral fluid such as water to selected areas prevents further etching and thus assists in obtaining a uniformly etched pattern. The flow pattern must also be controlled so that all surfaces receive the same quantity of fresh etchant. Rapid horizontal application of the etchant with repeated rotation of the specimen aids in preventing selective etching of the foil and provides uniform resulting screen pattern. Preferably, the person performing the etching flows the etchant fluid freely over the grid which is positioned as shown in FIG. 3 with the wire elements of the grid at about a 45 degree angle to the horizontal to help prevent thinning of the grid line at the screen periphery. For the preparation of copper screens the inventor has found that the etchant fluid suitably comprises an aqueous solution of approximately 25 oz./gal. sulfuric acid, 15 oz./gal. chromic acid and 2 oz./gal. of copper; maintained at a temperature in the range of 105 degrees ±5 degrees Fahrenheit.

EXAMPLE I

A translucent panel was prepared for use in a location wherein transmission of electromagnetic energy which could induce electrical current in metallic objects encountering the field and thus destroy or incapacitate sensitive equipment such as computers and the like. The panel, which must not unduly restrict vision therethrough was prepared by placing a screen having strands of about 4–6 mils wide by about 3 mils thick with 10 openings per square inch into a transparent glass panel. The screen was prepared by hand chemical blanking from one side only as taught herein. A high purity ASTM B451 copper foil, having a thickness of 0.0028 inches, was carefully cleaned to remove any foreign objects and inspected for any surface imperfections, such as dents, wrinkles, tears, etc. A section free of any visually apparent imperfections was cut to size using conventional scissors. To remove visible soils such as grease or oil from the surfaces of the foil, the surface was scrubbed with an aqueous mixture of equal parts of pumice and household cleanser. A soft bristle brush was used for the scrubbing operation and following the scrub, the surface was thoroughly rinsed with tap water. The cleaning process was continued until all surfaces were water break free. In the event surface areas of the copper being used are heavily oxidized, a solution of 1.5 lbs./gal. of aqueous ammonium persulfate and 1 fl. oz. of concentrated sulfuric acid per gallon may be utilized as an immersion cleaner. Following immersion the surfaces were rinsed thoroughly for five minutes in room temperature water rinse. Following the cleaning steps outlined above, the copper foil was immersed in a room temperature 20% aqueous solution of sulfuric acid for 30 seconds, following which the surfaces were thoroughly rinsed with tap water. All surfaces were then thoroughly air dried in a dust free atmosphere.

In a darkened room a coating of a positive photosensitive resists (AZ119, manufactured by the Shipley Company, Santa Clara, Calif.) was then applied in several individual coatings, to both sides of the foil, each consecutive coat being in the 0.0002 to 0.0004 inches thickness. Each coat was allowed to become tack free before applying the subsequent coat. Each coat was applied at a direction substantially perpendicular to the preceeding coat to insure uniform film build-up. A total film thickness of 0.0006 to 0.0012 inches was applied. Upon completion of the coating and air drying of the photosensitive resist on one side, the foil was carefully turned and the coating cycle repeated on the opposite side of the foil. The coating on the side to be printed with the grid was inspected to insure that it was free of all imperfections. The opposite side may be allowed to have minor imperfections such as sags and runs but there must be no evidence of pinholes of incomplete coverage. Suitable yellow light was used in the room to avoid exposing the photoresist.

The coated copper foil was then cured in an oven set at 185 degrees ±5 degrees Fahrenheit for 30 minutes to cure the photosensitive resist coating.

A screen photomaster negative was prepared in a dark room by a computer controlled photo plotter. A program on magnetic tape directed the photo plotter's light-pin to draw a full size pattern of the screen to be prepared on a large negative film. The plotter was set with a 0.006 inch light aperture. A 60×60 inch black and white film was centered on the plotter table and the grid drawn by the photo plotter. The film was then processed and developed in well known fashion and a bus bar area was included on the film to provide the electrical connection area around the periphery of the grid. The developed film was then used to expose and prepare the photosensitive resist coating in the desired grid pattern in the coating on the foil by the following steps. The photo resist coated copper foil was placed face up on the exposure table with the photosensitive resist side to be exposed facing up. The photomaster film, as prepared above, was placed over the coated foil with the emulsion side down and a glass cover placed over the top of the photomaster. A vacuum was drawn on the container and an absence of air bubbles indicated close contact between the photomaster and the part being exposed. The light source was then turned on and the coated foil exposed for a time sufficient to fully react the area not covered by the grid pattern. A developer was prepared by mixing one part photo resist developer (AZ 303A, Shipley Company, Santa Clara, Calif.) with four parts of tap water. The temperature of the developer was maintained at 120 degrees ±10 degrees Fahrenheit and the developer applied by spraying across the exposed photo resist surface and the unexposed back surface of the foil. When the image on the front surface became clear, the part was removed and thoroughly rinsed with cool tap water. The part then was permitted to dry in air under yellow light. The coated foil at this stage of the processing consisted of a thin copper sheet having a coherent layer of the unexposed photo resist material over the entire surface of one side thereof so that the copper was not accessible to the atmosphere or to a chemical etchant. On the opposed side of the foil, a grid of undeveloped photosensitive resist was present of the precise dimensions desired for the finished product with exposed areas between the grid lines. The cooled and developed photoresist was post-baked at 250 ±10 Farenheit for 15 minutes.

The foil carrying the undeveloped photosensitive resist film in the grid pattern on its first side and covered completely therewith on its reverse side was then exposed to an etchant comprising 25 ounces per gallon $H_2SO_4$, 15 ounces per gallon $CrO_3$ and 2 ounces per gallon copper by spraying or flowing the etchant over the surface in horizontal passes for ten to fifteen second intervals. The part was oriented in a vertical plane with the grid strands positioned at approximately 45° to the horizontal to assist drainage of the etchant solution from the part, thereby decreasing the chance of excessive etching in localized areas. The part was then rotated 90 degrees clockwise at intervals and the etching process continued. Continued application of the etching solution, and rotation of the part, interposed with removal of the etching solution by a light flow of cool tap water, permitted the operator to observe the progress of the etching process. A controlled yellow light was used to avoid exposure of the photosensitive resist. The etching process was continued until the desired grid line width was obtained. There remained the very fine grid size copper screen having the photosensitive resist remaining on both sides. The photosensitive resist was then removed by exposing both sides to the light source and stripping the then soluble resist with developer. Other suitable solvents such as methylethyl ketone could have been used to remove the resist and clean the grid.

The surface was visually inspected to insure quality and insure complete removal of the photosensitive resist. The screen was then deoxidized and tin-plated and again inspected to insure quality. The tin-plated screen was then laminated between a pair of ground glass plates with grounding wires attached to the bus bar structure left at the periphery of the screen during the etching process. The resulting laminate was found to have reasonable light transmission properties enabling an observer to see through the panel without significant loss of visual acuity.

The panel was found to have the ability to attenuate bursts of electromagnetic energy imposed thereupon, such as would be encountered in operation of a microwave heating apparatus or in other operational situations in which pulses of electromagnetic energy could impinge upon a transparent viewing panel. An example of another application is the windshields of aircraft and other vehicles which contain sensitive electronic gear subject to disruption from impingement of pulsed electromagnetic energy.

EXAMPLE II

A window for installation in a commercial aircraft carrying sensitive electronic gear was prepared according to the method set forth in Example I. The screen was chemically etched from a 3 mil thickness copper sheet. It had 10 square openings per inch and the strands making up the screen were approximately 4–6 mils wide by 3 mils thick. The screen covered the entire window aperture and was grounded with a solid conductive bus bar area of a width of about one quarter inch extending around the perimeter of the screen. The screen before installation in the laminated window structure was dull tin plated to minimize reflection. The window was installed in a side window of an aircraft. The screen was securely grounded to the aircraft frame. The resulting window had good optical properties and attenuated electromagnetic pulses to protect sensitive electronic gear in the aircraft.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A method of preparing a screen from a thin metal foil having thin wire strands with uninterrupted electrical conductivity in all directions comprising the steps of:
   (a) applying photosensitive coatings to first and second sides of said foil to form an adherent, etchant resistant coating thereon;
   (b) exposing a pattern in said coating on said first side to light and removing solubilized exposed areas of said coating whereby a grid pattern of an unexposed, protective, etchant resistant coating corresponding to the desired screen pattern remains on said first side of said foil with areas of said foil exposed;
   (c) applying by hand under visual observation a chemical etchant to said exposed areas of said foil on said first side when said foil is in an approximately vertical position;
   (d) observing the action of said chemical etchant to identify areas of uneven etching;
   (e) rinsing selected areas of said first side with a neutralizing fluid when necessary to prevent further etching;
   (f) rotating said foil into a new orientation while maintaining the foil in the approximately vertical position;
   (g) repeating steps (c), (d), (e) and (f) until said screen has been properly etched from said foil by removing exposed areas of said foil;
   (h) rinsing said chemical etchant from said grid;
   (i) removing all remaining coating on said first and said second sides of said foil; whereby a screen grid remains having unimpeded conductivity in all directions.

2. The method of claim 1 further including the step of plating the surface of said screen with a dissimilar metal to minimize light reflections.

3. The method of claim 1 or 2 further including the step of laminating said screen between transparent panels and grounding said screen to form a composit transparent panel having essentially unimpaired visual properties which attenuates pulsed electromagnetic energy impinged thereupon.

4. The method of claim 1 wherein said photosensitive coating forms a positive image upon exposure so that a visual pattern remains to aid the operator in performing the subsequent etching process.

5. The method of claim 1 wherein said foil is copper, said etchant comprising an aqueous solution of sulfuric acid and chromic acid.

6. The method of claim 5 wherein said etchant consists essentially of:
$H_2SO_4$: 20–30 ounces/gallon
$CrO_3$: 10–20 ounces/gallon Cu: 1-5 ounces/gallon
in an aqueous solution.

7. The process of claim 1 wherein said grid pattern is oriented during application of said etchant with the lines of said grid generally at 45° to the horizontal.

8. The process of claim 5 wherein said etchant is rinsed from said grid with water.

9. The process of claim 5 wherein said etchant is evenly applied to said exposed areas by flowing a stream of said etchant across the surface of said grid pattern in horizontal strokes.

10. The method of claim 1 including the step of forming conductive bus elements about the periphery of said screen.

11. The method of claim 1 wherein said step of removing all remaining coating on said first and said second sides of said foil comprises the steps of:
(i) exposing said remaining coating to light to render said remaining coating soluble; and
(ii) removing said remaining coating with a solvent for exposed coating.

* * * * *